(12) United States Patent
Yamamoto et al.

(10) Patent No.: US 6,379,784 B1
(45) Date of Patent: Apr. 30, 2002

(54) AROMATIC POLYIMIDE LAMINATE

(75) Inventors: Tomohiko Yamamoto; Katsumi Kato; Toshinori Hosoma; Kazuhiko Yoshioka, all of Ube (JP)

(73) Assignee: Ube Industries, Ltd., Yamaguchi (JP)

( * ) Notice: Subject to any disclaimer, the term of this patent is extended or adjusted under 35 U.S.C. 154(b) by 1 days.

(21) Appl. No.: 09/670,953

(22) Filed: Sep. 27, 2000

(30) Foreign Application Priority Data

Sep. 28, 1999 (JP) .......................................... 11-275068

(51) Int. Cl.⁷ .......................... B32B 7/02; B32B 15/08; B29C 47/00
(52) U.S. Cl. ................. 428/216; 156/308.2; 156/309.9; 428/213; 428/214; 428/215; 428/337; 428/421; 428/422; 428/458; 428/473.5
(58) Field of Search ................................ 428/213, 214, 428/215, 216, 337, 421, 422, 458, 473.5; 156/308.2, 309.9, 583.5, 307.7

(56) References Cited

U.S. PATENT DOCUMENTS 5,262,227 A * 11/1993 Takabayashi et al. ....... 428/215
5,741,598 A * 4/1998 Shiotani et al. ............. 428/458
6,203,918 B1 * 3/2001 Shimose et al. ............ 428/458

* cited by examiner

Primary Examiner—D. S. Nakarani
(74) Attorney, Agent, or Firm—Reed Smith LLP

(57) ABSTRACT

An aromatic polyimide laminate composed of an aromatic polyimide composite film, a metal film, and a release film is disclosed. The aromatic polyimide composite film is composed of an aromatic polyimide substrate film and two thermoplastic aromatic polyimide layers. Each thermoplastic layer is fixed to each surface of the substrate film. The substrate film has no glass transition temperature of lower than 350° C., and the thermoplastic aromatic polyimide layer has a glass transition temperature of 190–280° C. The metal film is fixed, with no intervening adhesive layer, to one thermoplastic aromatic polyimide layer at a 90° peel strength of 0.8 kg/cm or more and the release film is fixed, with no intervening adhesive layer, to another thermoplastic aromatic polyimide layer at a 90° peel strength of 0.001–0.5 kg/cm, under such condition that the latter peel strength is one half or less of the former peel strength.

19 Claims, 1 Drawing Sheet

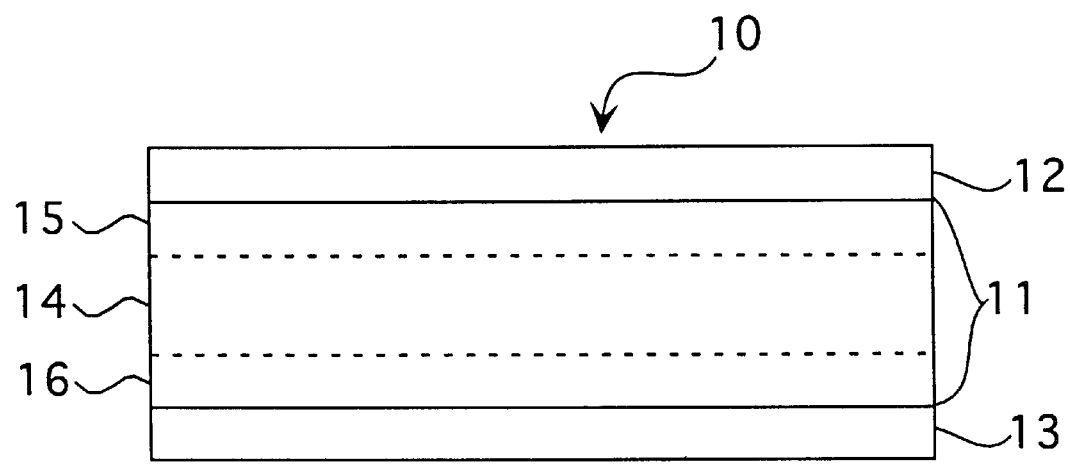
FIGURE

AROMATIC POLYIMIDE LAMINATE

FIELD OF THE INVENTION

The present invention relates an aromatic polyimide laminate comprising an aromatic polyimide composite film, a metal film, and a release film.

BACKGROUND OF THE INVENTION

Aromatic polyimide films show good high temperature resistance, good chemical properties, high electrical insulating property, and high mechanical strength, and therefore are widely employed in various technical fields. For instance, an aromatic polyimide film is favorably employed in the form of a continuous aromatic polyimide film/metal film composite sheet for manufacturing a flexible printed circuit board (FPC), a carrier tape for tape-automated-bonding (TAB), and a tape of lead-on-chip (LOC) structure.

The aromatic polyimide film/metal film composite sheet can be produced by bonding a polyimide film to a metal film using a conventional adhesive such as an epoxy resin. However, due to low heat-resistance of the conventional adhesive, the produced composite sheet cannot show satisfactory heat-resistance.

For obviating the above-mentioned problem, a variety of bonding methods have been proposed. For instance, an aromatic polyimide film/metal film composite sheet is manufactured by forming a copper metal film on an aromatic polyimide film by electro-plating. Otherwise, an aromatic polyamide solution (i.e., a solution of a precursor of the aromatic polyimide resin) is coated on a copper film, dried, and heated for producing a polyimide layer on the copper film.

An aromatic polyimide film/metal film composite sheet can be produced using a thermoplastic polyimide resin.

U.S. Pat. No. 4,543,295 describes a polyimide laminate which is produced by applying a pressure onto a composite sheet composed of an aromatic polyimide film, a polyimide adhesive, and a metal film in vacuo.

Japanese Patent Provisional Publications No. 4-33847 and No. 4-33848 disclose an aromatic polyimide film/metal film composite sheet manufactured by means of a roll press, which may produce a continuous composite sheet.

According to studies of the present inventors, it is not easy to employ the roll press for producing a continuous composite sheet having a large width. Moreover, wrinkles, creases or rumples are sometimes observed on the surface of the polyimide film of the produced continuous composite sheet.

SUMMARY OF THE INVENTION

It is an object of the invention to provide an aromatic polyimide laminate in which a metal film is bonded to an aromatic polyimide film at a high bonding strength with good appearance and a release film is attached to another surface of the aromatic polyimide film at a releasable bonding strength.

It is another object of the invention to provide a continuous aromatic polyimide laminate having a large width (such as 400 mm or more), namely in the form of a continuous web, in which a metal film is bonded to an aromatic polyimide film at a high bonding strength with good appearance and a release film is attached to another surface of the aromatic polyimide film at a releasable bonding strength.

The present invention resides in an aromatic polyimide laminate comprising an aromatic polyimide composite film, a metal film, and a release film, the aromatic polyimide composite film being composed of an aromatic polyimide substrate film and two thermoplastic aromatic polyimide layers, each of which is fixed to each surface of the substrate film, the substrate film having no glass transition temperature of lower than 350° C., the thermoplastic aromatic polyimide layer having a glass transition temperature of 190 to 280° C., in which the metal film is fixed, with no intervening adhesive layer, to one thermoplastic aromatic polyimide layer at a 90° peel strength of 0.8 kg/cm or more and the release film is fixed, with no intervening adhesive layer, to another thermoplastic aromatic polyimide layer at a 90° peel strength of 0.001 to 0.5 kg/cm, under such condition that the latter peel strength is one half or less of the former peel strength.

The above-mentioned aromatic polyimide laminate can be produced by a method comprising simultaneously pressing the metal film onto one side of the aromatic polyimide composite film and the release film onto another side of the aromatic polyimide composite film by means of a double belt press.

A representative double belt press is described in U.S. Pat. No. 4,599,128, and is commercially available from Held Corporation (Germany).

The present invention is very favorably employed for producing an aromatic polyimide laminate in the form of a continuous web having a width of 400 mm or more, particularly a width of 500 mm or more.

BRIEF DESCRIPTION OF DRAWING

FIGURE illustrates a schematic view of section of the aromatic polyimide laminate of the invention.

DETAILED DESCRIPTION OF THE INVENTION

The aromatic polyimide laminate of the invention generally which has a united structure typically has a section illustrated in the attached FIGURE.

The aromatic polyimide laminate 10 of the invention has a structure comprising an aromatic polyimide composite film 11, a metal film 12, and a release film 13. The aromatic polyimide composite film 11 is composed of an aromatic polyimide substrate film 14 and two thermoplastic aromatic polyimide layers 15, 16. One thermoplastic aromatic polyimide layer 15 is fixed to the adjoining surface of the substrate film 14, and another thermoplastic aromatic polyimide layer 16 is fixed to the adjoining surface of the substrate film 14.

The metal film 12 is fixed, with no intervening adhesive layer, to the thermoplastic aromatic polyimide layer 15 at a 90° peel strength of 0.8 kg/cm or more, preferably 0.9 kg/cm or more, more preferably 1.0 kg/cm or more. The release film 13 is fixed, with no intervening adhesive layer, to the thermoplastic aromatic polyimide layer 16 at a 90° peel strength of 0.001 to 0.5 kg/cm. The peel strength between the release film 13 and the polyimide layer 16 is one half or less of the peel strength between the metal film 12 and the polyimide layer 15.

The aromatic polyimide composite film shows on its both surfaces such thermoplasticity that each of the metal film and the release film is bonded to the surface of the composite film by heating under pressure.

The polyimide composite film preferably has a linear expansion coefficient of $30 \times 10^{-6}$ cm/cm/° C. or less which is a value measured in its machine direction (i.e., MD) in the temperature range of 50 to 200° C., and has a tensile modulus of elasticity of 300 kg/mm² or more, which is measured in its machine direction according to ASTM-D882.

The aromatic polyimide substrate film is highly heat-resistant and has no glass transition temperature of lower than 350° C. This means that the substrate film does not have a noticeable glass transition temperature or has a glass transition temperature of 350° C. or higher.

The aromatic polyimide substrate film per se preferably has a linear expansion coefficient of $5 \times 10^{-6}$ to $20 \times 10^{-6}$ cm/cm/° C., which is a value measured in its machine direction in the temperature range of 50 to 200° C., and preferably has a tensile modulus of elasticity of 300 kg/mm² or more, in which the tensile modulus of elasticity is measured in its machine direction according to ASTM-D882.

The aromatic polyimide substrate film preferably is prepared from one or more of the following polyimide materials:

polyimide prepared from 3,3',4,4'-biphenyltetracarboxylic dianhydride (s-BPDA) and p-phenylenediamine (PPD);

polyimide prepared from 3,3',4,4'-biphenyltetracarboxylic dianhydride (s-BPDA) and an aromatic diamine mixture of 85 molar % or more of p-phenylenediamine (PPD) and 15 molar % or less of 4,4'-diaminodiphenyl ether (DADE);

polyimide prepared from pyromellitic dianhydride (PMDA) and an aromatic diamine mixture of 10 to 90 molar % of p-phenylenediamine (PPD) and 90 to 10 molar % of 4,4'-diaminodiphenyl ether (DADE);

polyimide prepared from an aromatic tetracarboxylic acid dianhydride mixture of 3,3',4,4'-biphenyltetracarboxylic dianhydride (s-BPDA) and pyromellitic dianhydride (PMDA) and an aromatic diamine mixture of p-phenylenediamine (PPD) and 4,4'-diaminodiphenyl ether (DMDE); and polyimide prepared from an aromatic tetracarboxylic acid dianhydride mixture of 20 to 90 molar % of 3,3',4,4'-benzophenonetetracarboxylic dianhydride (BTDA) and 80 to 10 molar % of pyromellitic dianhydride (PMDA) and an aromatic diamine mixture of 30 to 90 molar % of p-phenylenediamine (PPD) and 70 to 10 molar % of 4,4'-diaminodiphenyl ether (DADE).

The aromatic polyimide of the substrate film can be prepared by random polymerization or block polymerization. Otherwise, previously prepared two or more kinds of polyamide acid solutions are mixed and then subjected to copolymerization to give an aromatic polyimide for the substrate film.

The reaction is generally performed in an organic solvent, using the diamine compound(s) and tetracarboxylic dianhydride(s) in essentially equimolar amounts to give an aromatic polyamide acid solution, in which a partially imidized polyamide acid may be present. In performing the reaction for preparing an aromatic polyamide acid, other aromatic tetracarboxylic dianhydrides and/or other aromatic diamines such as 4,4'-diaminodiphenylmethane may be employed in combination, provided that the employment of such additional compounds does not essentially vary the desired property of the polyimide of the substrate film. Moreover, the aforementioned aromatic tetracarboxylic dianhydride and aromatic diamine may have on their aromatic rings one or more substituents such as a fluorine atom, hydroxyl, methyl or methoxy.

Onto each surface of the substrate film is bonded a thermoplastic aromatic polyimide layer. The thermoplastic aromatic polyimide layer has a glass transition temperature of 190 to 280° C., preferably 200 to 275° C.

The thermoplastic aromatic polyimide layer is preferably prepared using one or more of the following polyimide materials:

polyimide prepared from 2,3,3',4'-biphenyltetracarboxylic dianhydride (a-BPDA) and 1,3-bis(4-aminophenoxy)benzene (TPER);

polyimide prepared from an aromatic tetracarboxylic acid dianhydride mixture of 2,3,3',4'-biphenyltetracarboxylic dianhydride (a-BPDA) and 4,4'-oxydiphthalic dianhydride (ODPA) and 1,3-bis(4-aminophenoxy)-2,2-dimethylpropane (DANPG); and polyimide prepared from an aromatic tetracarboxylic acid dianhydride mixture of pyromellitic dianhydride (PMDA) and 4,4'-oxydiphthalic dianhydride (ODPA) and 1,3-bis(4-aminophenoxy)benzene.

The thermoplastic polyimide layer can be prepared from a dope solution containing an aromatic polyamide acid in an organic solvent, which is produced from one of the combinations of the aromatic tetracarboxylic dianhydride(s) and diamine compound (s) by a reaction in an organic solvent at 100° C. or a lower temperature, particularly at a temperature of 20 to 60° C.

Alternatively, the thermoplastic polyimide layer can be formed using a solution of a thermoplastic polyimide which is produced by heating the polyamide acid at a temperature of 150 to 250° C., or heating the polyamide acid at a temperature of lower than 150° C., particularly 15 to 50° C., in the presence of a imidizing agent, to give the desired polyimide in the solution; removing the solvent by evaporation or precipitating the polyimide in a bad solvent, to give a polyimide powder; and then dissolving the polyimide powder in an appropriate solvent.

In the preparation of the polyamide acid for the thermoplastic polyimide layer, relatively small amounts of other aromatic tetracarboxylic dianhydrides and/or diamine compounds may be employed in combination in addition to these aromatic tetracarboxylic dianhydrides and diamine compounds, provided that no essential change of characteristics is brought about in the obtainable thermoplastic polyimide. Examples of the optionally employable aromatic tetracarboxylic dianhydrides include 3,3',4,4'-biphenyltetracarboxylic dianhydride, 2,2-bis(3,4-dicarboxyphenyl)propane dianhydride, and 2,3,6,7-naphthalenetetracarboxylic dianhydride.

Examples of the optionally employable diamine compounds include aromatic diamines which have a flexible molecular structure and contain plural benzene rings, such as 4,4'-diaminodiphenyl ether, 4,4'-diaminobenzophenone, 4,4'-diaminodiphenylmethane, 2,2-bis(4-aminophenyl)propane, 1,4-bis(4-aminophenoxy)benzene, 4,4'-bis(4-aminophenyl)diphenyl ether, 4,4'-bis(4-aminophenyl)diphenylmethane, 4,4'-bis(4-aminophenoxy)diphenyl ether, 4,4'-bis(4-aminophenoxy)diphenylmethane, 2,2-bis[4-aminophenoxy)phenyl]propane, and 2,2-bis[4-(4-aminophenoxy)phenyl]hexafluoropropane; aliphatic amines, such as 1,4-diaminobutane, 1,6-diaminohexane, 1,8-diaminooctane, 1,4-diaminodecane, and 1,12-diaminododecane; and diaminosiloxanes, such as bis(3-aminopropyl)tetramethyldisiloxane. The optionally employable aromatic diamine compound can be employed in an amount of 20 molar % or less, particularly 10 mol. % or less, per the total amount of the diamine compounds. The optionally employable aliphatic diamine or diaminosiloxane can be employed in an amount of 20 molar % or less, per the total amount of the diamine compounds. If the optionally employable diamine compound is incorporated in an amount exceeding the above-mentioned upper limit, the heatresistance of the resulting polyimide may become unsatisfactorily low.

In the preparation of the thermoplastic aromatic polyimide, a dicarboxylic anhydride such as phthalic anhydride or its derivative, hexahydrophthalic anhydride or its derivative, or succinic anhydride or its derivative can be incorporated so as to cap the amine terminal of the resulting aromatic polyimide.

In the preparation of the polyamide acid for the production of the thermoplastic polyimide layer, the diamine compound and the carboxylic anhydride compound (which includes a tetracarboxylic dianhydride and a dicarboxylic anhydride) are used in a molar ratio of 0.92:1 to 1.1:1, particularly 0.98:1 to 1.1:1, more particularly 0.99:1 to 1.1:1 in terms of the molar amount of the amino group and the molar amount of the carboxylic anhydride (i.e., the molar amount of the tetracarboxylic dianhydride, and the molar amount of the dicarboxylic anhydride, if it is used in combination). The dicarboxylic anhydride is preferably employed in a molar amount of 0.05 or less, based of one molar amount of the tetracarboxylic dianhydride. If the diamine compound and the carboxylic anhydride are used in a molar ratio outside of the above-mentioned range, the resulting thermoplastic aromatic polyimide becomes to have a relatively small molecular weight so that the thermoplastic aromatic polyimide layer shows a low bonding strength to a metal film.

Further, a gelation-inhibiting agent such as a phosphate-type stabilizer (e.g., triphenyl phosphite, or triphenyl phosphate) may be employed in the process of polymerization of the polyamide acid in an amount of 0.01 to 1%, based on the amount of the polyamide acid. Furthermore, an imidizing agent such as a basic organic catalyst (e.g., imidazole, 2-imidazole, 1,2-dimethylimidazole, or 2-phenylimidazole) may be added to the dope solution (i.e., polyamide acid solution) in an amount of 0.05 to 10 wt. %, particularly 0.1 to 2 wt. %, based on the amount of the polyamide acid. The imidizing agent is effective to well imidize the polyamide acid at a relatively low temperature.

In addition, a metal compound such as an organic aluminum compound (e.g., aluminum triacetylacetonate), an inorganic aluminum compound (e.g., aluminum hydroxide), or an organic tin compound may be incorporated into the dope solution in an amount of 1 ppm or more (in terms of the amount of metal), particularly 1 to 1,000 ppm, based on the amount of the polyamide acid, so that the thermoplastic polyimide layer can be bonded to a metal film at a higher bonding strength.

The preparation of the polyamide acid (for the preparation of the aromatic polyimide substrate film as well as for the preparation of the thermoplastic aromatic polyimide layer) can be performed in an organic solvent such as N-methyl-2-pyrollidone, N,N-dimethylformamide, N,N-dimethylacetamide, N, N-diethylacetamide, dimethylsulfoxide, hexamethylphosphoramide, N-methylcaprolactam, or cresol or its derivative. The organic solvents can be employed singly or in combination.

The aromatic polyimide composite sheet (i.e., multi-layered polyimide film) employed for the production of the aromatic polyimide laminate of the invention can be preferably produced by simultaneously casting a solution containing a precursor of the aromatic polyimide for the substrate in a solvent and a solution containing another aromatic polyimide for the thermoplastic polyimide layer or its precursor in a solvent on a temporary support. If desired, an additional solution containing an aromatic polyimide for the thermoplastic polyimide layer is also simultaneously casted so as to give a three-layered polyimide film having a structure of a thermoplastic polyimide layer/polyimide substrate film/thermoplastic polyimide layer. Examples of the temporary supports include a stainless mirror surface and a stainless belt. The cast solutions are then heated on the temporary support to a temperature of 100 to 200° C., so as to give a self-supporting semi-cured film or a self-supporting film containing a small amount of a solvent. A higher heating treatment may lower the desired bonding strength between the substrate film and the thermoplastic layer.

The simultaneous casting of a solution containing a precursor of the highly heat-resistant aromatic polyimide (for preparing the substrate film) in a solvent and a solution containing another aromatic polyimide (for preparing the thermoplastic polyimide layer) or its precursor in a solvent on a temporary support is described, for instance, in Japanese Patent Provisional Publication No. 3-180343 (=Japanese Patent Publication 7-102661). The simultaneous casting can be carried out using an extruding die.

The three-layered solution film of polyamide acid and/or polyimide produced by the simultaneous casting is dried by heating and then further heated to a temperature between the glass transition temperature (Tg) and the decomposition temperature of the polyimide for the thermoplastic polyimide layer, preferably at a temperature of 250 to 420° C. (surface temperature measured by means of a surface thermometer), preferably for a period of 1 to 60 minutes. Thus produced three-layered aromatic polyimide film is composed of a structure of thermoplastic polyimide layer/substrate film/thermoplastic polyimide layer.

The thermoplastic polyimide preferably has a glass transition temperature (Tg) of 190 to 280° C., particularly 200 to 275° C. The thermoplastic polyimide preferably does not melt at temperatures between its Tg and 300° C., and preferably shows a modulus of elasticity of 0.001 to 0.5 time at 275° C., based on a modulus of elasticity measured at 50° C.

The substrate film preferably has a thickness of 5 to 125 $\mu$m, while the thermoplastic polyimide layer preferably has a thickness of 1 to 25 $\mu$m (preferably 1 to 15 $\mu$m, more preferably 2 to 12 $\mu$m). In the polyimide composite film, the substrate film preferably has a thickness of 7.5 to 98.5%, particularly p15 to 90%, based on the total thickness of the composite film.

The thermoplastic polyimide layer preferably has a thickness larger than the surface roughness (Rz) of the metal film (i.e., metal foil) or the release film.

The simultaneous casting is favorably employed because it gives the composite film with less thermal deterioration.

The composite film preferably has a dimensional variation of less than ±0.10% at room temperature and a dimensional variation of less than ±0.10% at 150° C.

Examples of the metal films employed for the preparation of the composite sheet of the invention include copper film, aluminum film, iron film, gold film, or a film of metal alloy. Preferred are an electrolytic copper film and a rolled copper film. The metal film preferably has a surface roughness (Rz) of 10 $\mu$m or less, more preferably 0.5 to 7 $\mu$m. A metal film having such surface roughness is available under the name of VLP or LP (or HTE) for a copper film. There is no limitation with respect to the thickness of the metal film, but a thickness in the range of 5 to 60 $\mu$m, particularly 5 to 20 $\mu$m, is preferred.

The aromatic polyimide laminate of the invention has on one surface a metal film and on another surface a release film. The release film preferably has a surface roughness of 3 μm or less in terms of Rz, under such condition that the surface roughness of the release film is less than that of the metal film. Preferred examples of the release films include a fluorine-containing resin film and an aromatic polyimide film. Also preferred is a rolled aluminum film.

In the aromatic polyimide laminate of the invention, the following combinations are preferred:

1) The metal film is an electrolytic copper film having Rz in the range of 2 to 7 μm, and the release film is a polymer film (such as a fluororesin film or an aromatic polyimide film) having Rz in the range of 1.5 μm or less, preferably 1.0 μm or less;
2) The metal film is an electrolytic copper film having Rz in the range of 2 to 7 μm, and the release film is a rolled copper film having Rz in the range of 1.5 μm or less, preferably 1.0 μm or less;
3) The metal film is an electrolytic copper film having Rz in the range of 2.5 to 7 μm, and the release film is an aluminum film having Rz in the range of 2.0 μm or less; and
4) The metal film is a rolled copper film having Rz in the range of 0.5 to 1.5 μm, and the release film is a polymer film (such as a fluororesin film or an aromatic polyimide film) having Rz in the range of 1.5 μm or less, preferably 1.0 μm or less.

In the invention, a metal film, the aromatic polyimide composite film produced in the above-mentioned procedures, and a release film are overlaid in order and heated under pressure and cooled under pressure, preferably using a double belt press to manufacture the desired aromatic polyimide composite film. The double belt press using a heating liquid medium and a liquid hydraulic press is preferably employed.

In the manufacturing procedure of the polyimide laminate of the invention, a laminate of a metal film, the polyimide film and a release film is heated under pressure in a heating zone of a double belt press to a temperature in the range of from the temperature higher than Tg of the thermoplastic polyimide layer by 30° C. to 420° C., and subsequently is cooled (preferably to a temperature lower than Tg of the thermoplastic polyimide layer by 20° C., particularly by 30° C., or lower) still under pressure in the double belt press. It is preferred to preheat both of the multi-layered polyimide film and the metal film and release film before they are introduced into a double belt press. The drawing rate of the manufactured flexible united laminate from the double belt press can be 1 m/min. or more.

The use of the double belt press is particularly advantageous in the case of manufacturing a continuous flexible aromatic polyimide laminate (i.e., polyimide laminate web) having a width of approximately 400 mm or more, particularly approx. 500 mm or more. The resulting flexible polyimide laminate web has a 90° peel strength of 0.8 kg/cm or more, particularly 1 kg/cm or more, on the interface between the metal film and the polyimide composite film and has good appearance having almost no wrinkles or rumples on the surface of the thermoplastic polyimide layer having been bonded to the metal film, and has a 90° peel strength of 0.001 to 0.5 kg/cm, on the interface between the release film and the polyimide composite film and has good appearance having almost no wrinkles or rumples on the surface of the thermoplastic polyimide layer having been bonded to the release film.

The flexible aromatic polyimide laminate web stored in the form of a roll can be extended, etched and cut to give, for example, a substrate for an electronic device. Accordingly, the aromatic polyimide laminate of the invention can be in the form of a small piece.

The invention is further described by the following examples, in which "part(s)" means "part(s) by weight".

In the following examples, the physical characteristics and bonding strength of the polyimide laminate were determined by the methods described below:

Thermal expansion coefficient: 20 to 200° C., measured at 5°/min. (mean value in TD and MD directions), cm/cm/° C.;

Glass transition temperature (Tg): determined from a measured viscoelasticity;

Bonding strength: given in terms of 90° peel strength;

Appearance: the surface of polyimide film is observed with respect to wrinkles, creases or rumples, and marked in the following manner, AA for good, BB for unsatisfactory, CC for bad.

Preparation of Dope-1 for Preparing Substrate Film

In a reaction vessel equipped with a stirrer and a nitrogen gas-inlet was placed N-methyl-2-pyrollidone. Into the vessel were then placed p-phenylenediamine (PPD) and 3,3',4,4'-biphenyltetracarboxylic dianhydride (sBPDA) in a molar ratio of 1000:998, so as to prepare a solution containing the monomers at 18 wt. % concentration. After the addition was complete, the mixture was kept at 50° C. for 3 hours, for completing the reaction. The obtained reaction mixture was a polyamide acid solution in the form of a brown viscous liquid showing a viscosity of approximately 1,500 poise (at 25° C.).

The resulting solution was employed as Dope-1.

Preparation of Dope-2 for Preparing Thermoplastic Polyimide Layer

In a reaction vessel equipped with a stirrer and a nitrogen gas-inlet was placed N-methyl-2-pyrollidone. Into the vessel were then placed 1,3-bis(4-aminophenoxy)benzene (TPE-R) and 2,3,3',4'-biphenyltetracarboxylic dianhydride (a-BPDA) in a molar ratio of 1000:1000, so as to prepare a solution containing the monomers at 22 wt. % concentration. Further, triphenyl phosphate was added in an amount of 0.1 wt. %, based on the amount of the monomers. After the addition was complete, the mixture was kept at 25° C. for 1 hour, for completing the reaction. The obtained reaction mixture was a polyamide acid solution in the form of a viscous liquid showing a viscosity of approximately 2,000 poise (at 25° C.).

The resulting solution was employed as Dope-2.

Productions of Polyimide Composite Film

Dope-2, Dope-1 and Dope-2 were extruded from an extruding die having three slits (multi-manifold die) to simultaneously coat Dope-2, Dope-1 and Dope-2 in order on a metallic support. Thus coated layers were continuously heated using an air heated to 140° C. Thus formed solid film was separated from the support, and placed in a heating furnace. In the furnace, the solid film was heated gradually by increasing the temperature from 200° C. to 320° C. for removing the solvent and completing imidation, so that a continuous three-layered aromatic polyimide composite film was produced and wound around a winding roll.

Thus, the continuous aromatic polyimide composite film (thermoplastic polyimide layer/polyimide substrate film/thermoplastic polyimide layer) was produced:

Thickness: 4 µm/17 µm/4 µm

Linear expansion coefficient (50–200° C.): 23 ppm/° C. (MD: machine direction) 19 ppm/° C. (TD: traverse direction)

Tensile modulus of elasticity (MD, measured according to ASTM-D882): 526 kg/mm$^2$ Tg of substrate polyimide: not observed at temperatures of lower than 400° C.

Tg of thermoplastic polyimide: 250° C.

Modulus of elasticity of thermoplastic polyimide at 275° C.: approximately 0.002 time of that at 50° C.

EXAMPLE 1

An electrolytic copper film of 18 µm thick (CF-T9, VP, available from Fukuda Metal Foil Powder Industries, Co., Ltd., Rz=5 µm), the multi-layered polyimide composite film which was pre-heated to approximately 150° C., and a fluororesin film (release film) of 38 µm thick (PTFE, Rz<1 µm) were overlaid in order and introduced into a double belt press. In the heating zone of the double belt press, the overlaid films were heated up to 380° C. (highest temperature) under pressure, and then cooled in the cooling zone down to 117° C. (lowest temperature) under pressure, to manufacture a united flexible laminate (width: approximately 530 mm), which was then wound around a winding roll.

The evaluation on the obtained flexible laminate was shown below:

90° peel strength:
copper film/polyimide composite: 1.2 kg/cm
resin film/polyimide composite: 0.001 kg/cm appearance on the polyimide composite after peeling the resin film off: no wrinkles were observed.

EXAMPLE 2

The procedures of Example 1 were repeated except for replacing the fluororesin film with an aromatic polyimide film (Upilex S, available from Ube Industries, Ltd., Rz<1 µm, thickness: 25 µm).

The evaluation on the obtained flexible laminate was given below:

90° peel strength:
copper film/polyimide composite: 1.3 kg/cm
polyimide film/polyimide composite: 0.002 kg/cm appearance on the polyimide composite after peeling the polyimide film off: no wrinkles were observed.

EXAMPLE 3

The procedures of Example 1 were repeated except for replacing the fluororesin film with an aromatic polyimide film (Upilex SMB, available from Ube Industries, Ltd., Rz<2 µm, thickness: 40 µm).

The evaluation on the flexible laminate was shown below:

90° peel strength:
copper film/polyimide composite: 1.2 kg/cm
polyimide film/polyimide composite: 0.01 kg/cm appearance on the polyimide composite after peeling the polyimide film off: no wrinkles were observed.

EXAMPLE 4

The procedures of Example 1 were repeated except for replacing the fluororesin film with a commercially available rolled copper film (Rz on the shiny side to be fixed to the polyimide film=0.7 µm, thickness: 15 µm).

The evaluation on the obtained flexible laminate was given below:

90° peel strength:
electrolytic copper film/polyimide composite: 1.1 kg/cm
rolled copper film/polyimide composite: 0.3 kg/cm appearance on the polyimide composite after peeling the rolled copper film off: no wrinkles were observed.

EXAMPLE 5

The procedures of Example 1 were repeated except for replacing the electrolytic copper film of 18 µm thick (CF-T9, VP, Rz=5 µm) with an electrolytic copper film of 12 µm thick (CF-T9, VP, available from Fukuda Metal Foil Powder Industries, Co., Ltd., Rz=4.5 µm) and further replacing the fluororesin film with a commercially available aromatic polyimide film (Upilex S, available from Ube Industries, Ltd., Rz=0.01 µm, thickness: 25 µm).

The evaluation on the obtained flexible laminate was given below:

90° peel strength:
electrolytic copper film/polyimide composite: 1.0 kg/cm
rolled copper film/polyimide composite: 0.002 kg/cm appearance on the polyimide composite after peeling the rolled copper film off: no wrinkles were observed.

EXAMPLE 6

The procedures of Example 5 were repeated except for replacing the electrolytic copper film of 12 µm thick (CF-T9, VP, Rz=4.5 µm) with an electrolytic copper film of 9 µm thick (CF-T9, VP, available from Fukuda Metal Foil Powder Industries, Co., Ltd., Rz=4.5 µm).

The evaluation on the obtained flexible laminate was given below:

90° peel strength:
copper film/polyimide composite: 0.9 kg/cm
resin film/polyimide composite: 0.002 kg/cm appearance on the polyimide composite after peeling the resin film off: no wrinkles were observed.

EXAMPLE 7

The procedures of Example 5 were repeated except for replacing the electrolytic copper film of 12 µm thick (CF-T9, VP, Rz=4.5 µm) with a rolled copper film of 18 µm thick (BHY13HT, available from Japan Energy Co., Ltd., Rz=0.8 µm).

The evaluation on the obtained flexible laminate was given below:

90° peel strength:
copper film/polyimide composite: 1.3 kg/cm
resin film/polyimide film: 0.002 kg/cm appearance on the polyimide composite after peeling the resin film off: no wrinkles were observed.

EXAMPLE 8

The procedures of Example 5 were repeated except for replacing the electrolytic copper film of 12 µm thick (CF-T9, VP, Rz=4.5 µm) with a rolled copper film of 12 µm thick (BHY22B, available from Japan Energy Co., Ltd., Rz=0.8 µm).

The evaluation on the obtained flexible laminate was given below:

90° peel strength:
copper film/polyimide composite: 1.0 kg/cm
resin film/polyimide composite: 0.002 kg/cm
appearance on the polyimide composite after peeling the resin film off: no wrinkles were observed.

EXAMPLE 9

The procedures of Example 1 were repeated except for replacing the fluororesin film with an aluminum film (available from Sun Aluminum Industries Co., Ltd., Rz<1.7 μm, thickness: 20 μm).

The evaluation on the obtained flexible laminate was given below:
90° peel strength:
copper film/polyimide composite: 1.2 kg/cm
aluminum film/polyimide composite: 0.005 kg/cm
appearance on the polyimide film after peeling the aluminum film off: no wrinkles were observed.

COMPARISON EXAMPLE 1

The procedures of Example 1 were repeated except for placing on each surface of the polyimide composite film an electrolytic copper film of 18 μm thick (CF-T9, VP, available from Fukuda Metal Foil Powder Industries Co., Ltd., Rz=5 μm).

The evaluation on the obtained flexible laminate was given below:
90° peel strength:
copper film/polyimide composite: both 1.0 kg/cm
appearance on the polyimide composite after peeling the copper film off: wrinkles were observed.

COMPARISON EXAMPLE 2

The procedures of Example 1 were repeated except for placing on each surface of the polyimide composite film an electrolytic copper film of 9 μm thick (CF-T9, VP, available from Fukuda Metal Foil Powder Industries Co., Ltd., Rz=4.5 μm).

The evaluation on the obtained flexible laminate was given below:
90° peel strength:
copper film/polyimide composite:
0.9 kg/cm (upper side)
0.8 kg/cm (lower side)
appearance on the polyimide composite after peeling the copper film off: wrinkles were observed.

EXAMPLE 10

The release film was peeled off from the laminate obtained in each of Examples 1 to 9. The thermoplastic polyimide layer which was exposed by the peeling-off procedure was overlaid on a electrolytic copper film (thickness: 18 μm), and heated to 340° C. at a pressure of 60 kg/cm for 5 minutes to give a united laminate of copper film/polyimide composite film/copper film. No wrinkles were observed on the exposed thermoplastic polyimide layer.

Each of the produced laminates of copper film/polyimide composite film/copper film was easily bent and squeezed without damage.

What is claimed is:

1. An aromatic polyimide laminate comprising an aromatic polyimide composite film, a metal film, and a release film, the aromatic polyimide composite film being composed of an aromatic polyimide substrate film and two thermoplastic aromatic polyimide layers, each of which is fixed to each surface of the substrate film, the substrate film having no glass transition temperature of lower than 350° C., the thermoplastic aromatic polyimide layer having a glass transition temperature of 190 to 280° C., in which the metal film is fixed, with no intervening adhesive layer, to one thermoplastic aromatic polyimide layer at a 90° peel strength of 0.8 kg/cm or more and the release film is fixed, with no intervening adhesive layer, to another thermoplastic aromatic polyimide layer at a 90° peel strength of 0.001 to 0.5 kg/cm, under such condition that the latter peel strength is one half or less of the former peel strength.

2. The aromatic polyimide laminate of claim 1, wherein the metal film is fixed, with no intervening adhesive layer, to one thermoplastic aromatic polyimide layer at a 90° peel strength of 0.9 kg/cm or more.

3. The aromatic polyimide laminate of claim 1, wherein the aromatic polyimide substrate film has a linear expansion coefficient of $5 \times 10^{-6}$ to $20 \times 10^{-6}$ cm/cm/° C. which is a value measured in its machine direction in the temperature range of 50 to 200° C.

4. The aromatic polyimide laminate of claim 1, wherein the aromatic polyimide substrate film has a tensile modulus of elasticity of 300 kg/mm$^2$ or more, the tensile modulus of elasticity being measured in its machine direction according to ASTM-D882.

5. The aromatic polyimide laminate of claim 1, wherein the aromatic polyimide substrate film comprises at least one polyimide material selected from the group consisting of:

polyimide prepared from 3,3',4,4'-biphenyltetracarboxylic dianhydride and p-phenylenediamine;

polyimide prepared from 3,3',4,4'-biphenyltetracarboxylic dianhydride and an aromatic diamine mixture of 85 molar % or more of p-phenylenediamine and 15 molar % or less of 4,4'-diaminodiphenyl ether;

polyimide prepared from pyromellitic dianhydride and an aromatic diamine mixture of 10 to 90 molar % of pphenylenediamine and 90 to 10 molar % of 4,4'-diaminodiphenyl ether;

polyimide prepared from an aromatic tetracarboxylic acid dianhydride mixture of 3,3',4,4'-biphenyltetracarboxylic dianhydride and pyromellitic dianhydride and an aromatic diamine mixture of p-phenylenediamine and 4,4'-diaminodiphenyl ether; and polyimide prepared from an aromatic tetracarboxylic acid dianhydride mixture of 20 to 90 molar % of 3,3',4,4'-benzophenonetetracarboxylic dianhydride and 80 to 10 molar % of pyromellitic dianhydride and an aromatic diamine mixture of 30 to 90 molar % of p-phenylenediamine and 70 to 10 molar % of 4,4'-diaminodiphenyl ether.

6. The aromatic polyimide laminate of claim 1, wherein the aromatic polyimide substrate film has a thickness of 5 to 125 μm.

7. The aromatic polyimide laminate of claim 1, wherein the thermoplastic aromatic polyimide layer has a glass transition temperature of 200 to 275° C.

8. The aromatic polyimide laminate of claim 1, wherein the thermoplastic aromatic polyimide layer comprises at least one polyimide material selected from the group consisting of:

polyimide prepared from 2,3,3',4'-biphenyltetracarboxylic dianhydride and 1,3-bis(4-aminophenoxy)benzene;

polyimide prepared from an aromatic tetracarboxylic acid dianhydride mixture of 2,3,3',4'-biphenyltetracarboxylic dianhydride and 4,4'-oxydiphthalic dianhydride and 1,3-bis(4-aminophenoxy)-2,2-dimethylpropane;

and polyimide prepared from an aromatic tetracarboxylic acid dianhydride mixture of pyromellitic dianhydride and 4,4'-oxydiphthalic dianhydride and 1,3-bis(4-aminophenoxybenzene).

9. The aromatic polyimide laminate of claim 6, wherein the thermoplastic aromatic polyimide layer has a thickness of 1 to 25 μm, under such condition that the thickness of the polyimide layer is less than that of the polyimide substrate film.

10. The aromatic polyimide laminate of claim 1, wherein the metal film is selected from the group consisting of copper film, aluminum film, gold film and a film of metal alloy.

11. The aromatic polyimide laminate of claim 1, wherein the metal film is an electrolytic copper film or a rolled copper film.

12. The aromatic polyimide laminate of claim 1, wherein the metal film has a surface roughness of 0.5 to 10 μm in terms of Rz.

13. The aromatic polyimide laminate of claim 1, wherein the metal film has a thickness of 5 to 60 μm.

14. The aromatic polyimide laminate of claim 12, wherein the release film has a surface roughness of 3 μm or less in terms of Rz, under such condition that the surface roughness of the release film is less than that of the metal film.

15. The aromatic polyimide laminate of claim 1, wherein the release film is a fluorine-containing resin film or an aromatic polyimide film.

16. The aromatic polyimide laminate of claim 14, wherein the release film is a rolled aluminum film.

17. The aromatic polyimide laminate of claim 1, wherein the laminate is in the form of a continuous web having a width of 400 mm or more.

18. A method for producing an aromatic polyimide laminate comprising an aromatic polyimide composite film, a metal film, and a release film, the aromatic polyimide composite film being composed of an aromatic polyimide substrate film and two thermoplastic aromatic polyimide layers, each of which is fixed to each surface of the substrate film, the substrate film having no glass transition temperature of lower than 350° C., the thermoplastic aromatic polyimide layer having a glass transition temperature of 190 to 280° C., in which the metal film is fixed, with no intervening adhesive layer, to one thermoplastic aromatic polyimide layer at a 90° peel strength of 0.8 kg/cm or more and the release film is fixed, with no intervening adhesive layer, to another thermoplastic aromatic polyimide layer at a 90° peel strength of 0.001 to 0.5 kg/cm, under such condition that the latter peel strength is one half or less of the former peel strength, which comprises simultaneously pressing the metal film onto one side of the aromatic polyimide composite film and the release film onto another side of the aromatic polyimide composite film by means of a double belt press.

19. A method for producing a continuous aromatic polyimide laminate web comprising an aromatic polyimide composite film, a metal film, and a release film, the aromatic polyimide composite film being composed of an aromatic polyimide substrate film and two thermoplastic aromatic polyimide layers, each of which is fixed to each surface of the substrate film, the substrate film having no glass transition temperature of lower than 350° C., the thermoplastic aromatic polyimide layer having a glass transition temperature of 190 to 280° C., in which the metal film is fixed, with no intervening adhesive layer, to one thermoplastic aromatic polyimide layer at a 90° peel strength of 0.8 kg/cm or more and the release film is fixed, with no intervening adhesive layer, to another thermoplastic aromatic polyimide layer at a 90° peel strength of 0.001 to 0.5 kg/cm, under such condition that the latter peel strength is one half or less of the former peel strength, which comprises continuously and simultaneously pressing the metal film web onto one side of the aromatic polyimide composite film web and the release film web onto another side of the aromatic polyimide composite film web by means of a double belt press.

\* \* \* \* \*